United States Patent
Xu

(10) Patent No.: US 8,193,075 B2
(45) Date of Patent: Jun. 5, 2012

(54) REMOTE HYDROGEN PLASMA WITH ION FILTER FOR TERMINATING SILICON DANGLING BONDS

(75) Inventor: Zhi Xu, Shanghai (CN)

(73) Assignee: Applied Materials, Inc., Santa Clara, CA (US)

( * ) Notice: Subject to any disclaimer, the term of this patent is extended or adjusted under 35 U.S.C. 154(b) by 42 days.

(21) Appl. No.: 12/757,341

(22) Filed: Apr. 9, 2010

(65) Prior Publication Data

US 2011/0008950 A1     Jan. 13, 2011

Related U.S. Application Data

(60) Provisional application No. 61/170,838, filed on Apr. 20, 2009.

(51) Int. Cl.
*H01L 21/322* (2006.01)
(52) U.S. Cl. .................. 438/475; 438/471; 257/E21.212
(58) Field of Classification Search .................. 438/475, 438/474, 473, 471; 257/E21.212, E21.616
See application file for complete search history.

(56) References Cited

U.S. PATENT DOCUMENTS

| 2005/0054209 | A1* | 3/2005 | Hsu et al. ....................... 438/725 |
| 2007/0117397 | A1 | 5/2007 | Fu et al. |
| 2007/0190266 | A1* | 8/2007 | Fu .................................. 427/569 |
| 2007/0202708 | A1* | 8/2007 | Luo et al. ....................... 438/758 |
| 2008/0268263 | A1* | 10/2008 | Yamazaki ....................... 428/446 |
| 2010/0009488 | A1* | 1/2010 | Sivaram et al. ................. 438/57 |

OTHER PUBLICATIONS

Cheung, Kin P., "Thin gate-oxide reliability—the current status", *Symposium on Nano Device Technology*, Taiwan 2001, 6 pp.
Singh, Sunil Kumar, et al., "Further Insights into the Mechanism of Hydrogen-Plasma Surface Passivation of Low-Dielectric Constant Hydrogen Silsesquioxane (HSQ)", *Journal of the Korean Physical Society*, vol. 49, No. 3, Sep. 2003, 1312-1316 pp.

* cited by examiner

*Primary Examiner* — Walter L Lindsay, Jr.
(74) *Attorney, Agent, or Firm* — Diehl Servilla LLC

(57) ABSTRACT

Apparatus and methods for repairing silicon dangling bonds resulting from semiconductor processing are disclosed. The silicon dangling bonds can be repaired by introducing hydrogen radicals with substantially no hydrogen ions into the processing chamber to react with the silicon dangling bonds, eliminating them.

19 Claims, 6 Drawing Sheets

US 8,193,075 B2

REMOTE HYDROGEN PLASMA WITH ION FILTER FOR TERMINATING SILICON DANGLING BONDS

CROSS REFERENCE TO RELATED APPLICATIONS

This application claims the benefit of priority under 35 U.S.C. §119(e) to U.S. Provisional Patent Application No. 61/170,838, filed Apr. 20, 2009, which is hereby incorporated by reference in its entirety.

BACKGROUND

Embodiments of the present invention generally relate to methods and apparatus for semiconductor processing. Specific embodiments pertain to methods and apparatus to minimize or eliminate dangling silicon bonds during semiconductor processing.

It is well known that p-n type diodes are not feasible for solar cells due to the following factors: (1) the doping capability of amorphous Si:H (a-Si:H) is rather poor; (2) doping has a detrimental effect on a-Si:H layer quality because the dopants lead to the creation of many additional Si dangling bonds, which are the main recombination centers in this material; and (3) in a classical p-n type diode, carrier collection is obtained by minority carrier diffusion within p- and n-type layers.

For crystalline silicon (especially single crystal silicon), the diffusion lengths for dopants are longer than 200 μm, which ensures the superior collection efficiency at one end of the diodes. However, such a diffusion length (for minority carrier) is very small, less than 0.1 μm in most a-Si:H. To resolve this problem, p-i-n diodes are always used for a-Si:H, with each layer (p-, i- and n-region) being extremely thin. The total thickness of the three layers is usually about 0.2 μm-0.3 μm.

The similar situation is also true for micro-crystalline Si:H (μ-Si:H) as well. Due to the relaxation of the requirement of μ—Si:H (longer minority carrier diffusion length), the total thickness of the n-i-p structure of μ-Si:H could be around 1.5-3 μm, though the n-layer and p-layer are still extremely thin.

In either a-Si:H layers or μ-Si:H layers, there are quite a few silicon dangling bonds within the films, partially due to the low temperature process. These dangling bonds are the recombination centers for carrier. In order to reduce the amount of the dangling bonds, the common practice is to perform a forming gas anneal (e.g., with 5-10% $H_2$ in $N_2$ gas) at elevated temperature. However, it is known in semiconductor processing that the temperature has to be as high as 400° C. to make such a forming gas anneal effective (e.g., to reduce negative bias temperature instability and gate oxide integrity problems for devices). Normally, such an anneal is performed at the aluminum alloy formation step for the bond-pad.

In solar cell production, the thermal budget is quite limited due to many concerns. The commonly used plasma enhanced chemical vapor deposition (PECVD) temperature, for a-Si:H with p-i-n or μ-Si:H with n-i-p, is around 200° C. or below. Then, the highest temperature one can use for any process after the silicon deposition is less than 200° C. At this temperature, the forming gas anneal will not effectively passivate the silicon dangling bonds in PECVD formed films.

However, if in-situ low temperature (e.g., 200° C.) hydrogen plasma is applied, hydrogen ions could have high energy and large energy dispersion. These $H^+$ ions could have major detrimental impacts on the transparent conductive oxide (TCO) film (e.g., indium oxide and tin oxide) which is deposited prior to the silicon film deposition.

Therefore, there is a need in the art for methods and apparatus to improve the low temperature passivation efficiency of semiconductors.

SUMMARY OF THE INVENTION

One or more embodiments of the present invention relates to methods of processing a silicon layer on a substrate. The methods comprise disposing a substrate in a chamber having a remote plasma source coupled thereto. A silicon layer is processed and silicon dangling bonds are created in the silicon layer. A hydrogen plasma is generated in the remote plasma source, the hydrogen plasma comprising a mixture including hydrogen radicals and ions. The hydrogen plasma is passed through an ion filter is passed through an ion filter to remove essentially all of the ions. The silicon layer containing dangling bonds is exposed to the filtered hydrogen plasma to remove the silicon dangling bonds.

In detailed embodiments, the step of processing the silicon layer includes one or more of etching and doping the silicon layer. In specific embodiments, processing the silicon layer comprises etching the silicon layer and creating dangling silicon bonds. In further specific embodiments, processing the silicon layer comprises doping the silicon layer creating silicon dangling bonds.

According to some detailed embodiments, the hydrogen plasma has a temperature less than about 400° C. In more specific embodiments, the hydrogen plasma has a temperature less than about 300° C. In further specific embodiments, the hydrogen plasma has a temperature less than about 200° C.

In one or more embodiments, the hydrogen radicals in the hydrogen plasma, which have passed through the ion filter, have an energy level that has been reduced to prevent damage to the silicon layer.

The hydrogen radicals of detailed embodiments penetrate the silicon layer to a depth of less than about 3 μm. In more detailed embodiments, the hydrogen radicals penetrate the silicon layer to a depth of less than about 2 μm.

In some embodiments, the silicon layer is part of a gate electrode. In detailed embodiments, the gate electrode comprises polysilicon gates and the dangling bonds are created during an etching process.

In one or more embodiments, the silicon layer is a p-type or n-type silicon which has been deposited onto a transparent conductive oxide layer on a silicon substrate. The silicon layer of specific embodiments is part of a photovoltaic cell and the energy of the hydrogen radicals is such that they cause substantially no damage to the transparent conductive oxide layer.

The silicon layer of some embodiments is a silicon oxide layer deposited on a silicon substrate with one or more of P, As and $BF_2$ implanted therein. In specific embodiments the method is part of a flash memory manufacturing process.

Other aspects of the invention relate to methods of processing a Si:H layer on solar cell. The method comprises disposing a substrate in a chamber having a remote plasma source coupled thereto. Dangling silicon bonds are created in the Si:H layer. A hydrogen plasma is generated in the remote plasma source, the hydrogen plasma comprising a mixture including hydrogen radicals and ions. The hydrogen plasma is passed through an ion filter to remove essentially all of the ions and the Si:H layer containing dangling bonds is exposed to the filtered hydrogen plasma to remove dangling silicon bonds.

In detailed embodiments, the Si:H layer comprises polysilicon. In one or more embodiments, the Si:H layer comprises micro-crystalline silicon. In specific embodiments the Si:H layer is disposed on a transparent conductive oxide layer and the plasma has substantially no negative impact on the transparent conductive oxide layer.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the singular forms "a", "an" and "the" include plural referents unless the context clearly indicates otherwise. For example, reference to a "superstrate" may also refer to more than one superstrate, and the like.

According to an embodiment of the invention, a practical and effective way to greatly improve the efficiency of generating ion-free H radicals and the H radicals to passivate silicon dangling bonds is provided. In one embodiment, a remote hydrogen plasma source with an ion filter (e.g., RPS system on top of a PECVD chamber) can be employed. The hydrogen radicals (without ions) can be introduced into a chamber after the PECVD deposition process. With the ion filter, the hydrogen radicals should have minimum energy so that only the ions could be accelerated in the electric field of the plasma. Therefore, the hydrogen radicals should have minimum impact (i.e., has substantially no negative impact) on a previously deposited TCO film.

The hydrogen radicals generated from the remote plasma should be much more effective than the $H_2$ molecules obtained from the forming gas at low temperature in terms of passivating silicon dangling bonds inside the PECVD deposited p-i-n a-Si:H layers or n-i-p μ-Si:H layers. The top p-i-n a-Si:H film is rather thin, with the total thickness of less than 0.2-0.3 μm. Hydrogen radicals can be applied to passivate the dangling bonds in the film immediately after the deposition. Therefore, it might be beneficial to maintain the hydrogen radicals at minimum energy to allow for the removal of hydrogen ions which could penetrate the thin p-i-n layer and cause damage to a TCO film below.

For the recent tandem or multiple junction solar cell structure, it is found that there is the need to deposit a TCO film to separate the different junctions, e.g., a zinc oxide or indium oxide film between the a-Si:H (on top) and μ-Si:H (on bottom). The film thickness of p-i-n a-Si:H is normally thin, less than 2-3 μm in total. It is relatively easy for hydrogen radicals to penetrate through the micro-crystalline silicon via the column-like grain boundaries. Therefore, it might be beneficial to maintain the hydrogen radicals at minimum energy to decrease the likelihood of radical penetration of the micro-crystalline film having an adverse impact on the TCO film below.

Application of the invention described herein may be useful for a wide variety of silicon processing. Non-limiting examples include passivating the silicon dangling bonds in gate oxides for semiconductor devices (instead of using a forming gas anneal at the aluminum alloy stage).

Figure 1:
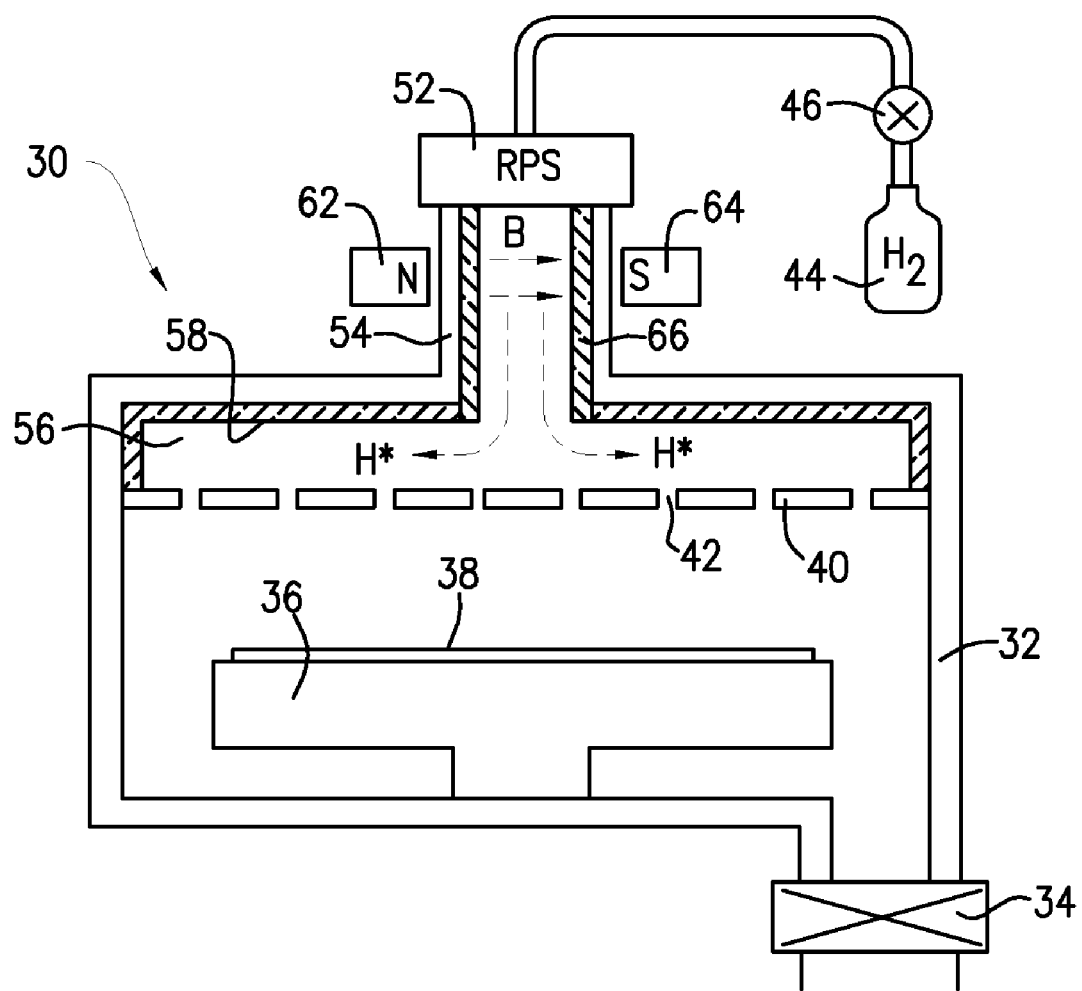
FIG. 1 shows a cross-section of a processing chamber having a remote plasma source for use in accordance with aspects of the present invention.

A remote plasma cleaning chamber 30 illustrated in the cross-sectional view of FIG. 1 includes a vacuum chamber 32 pumped by a vacuum pump system 34. A pedestal 36 within the chamber 30 supports a wafer 38 to be treated in opposition to a gas showerhead 40 supplying a process gas through a large number of apertures 42. The pedestal 36 includes a heater (not shown) to raise the temperature of the wafer 38 to a desired temperature. According to one or more aspect of the invention, the treating gas is either pure hydrogen gas ($H_2$), which is supplied from a hydrogen gas source 44 through a mass flow controller 46. A remote plasma source 52 receives the gas and excites it into a plasma. The remote plasma source 52 may be a pair of electrodes positioned on opposed sides of a delivery tube for the treating gas and driven by an RF power source or an RF inductive coil around the delivery tube or other type of antenna, although other types of plasma generators are possible. The excited gas is delivered though a supply tube 54 to a gas manifold 56 in back of the showerhead 40. A liner 58 may cover the walls of the manifold 56. The excited gas is thus delivered uniformly through the showerhead 40 to the wafer 38 being treated.

Figure 2:
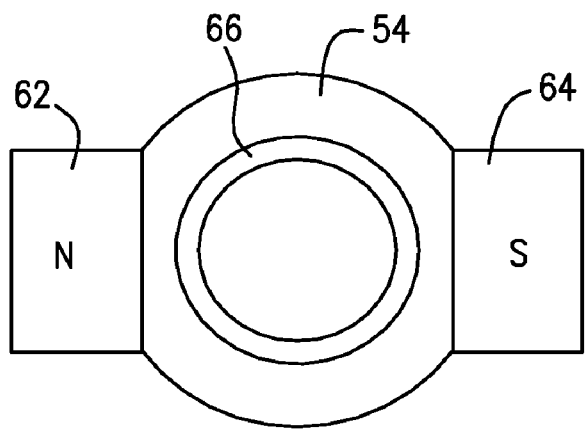
FIG. 2 shows an axial cross-section of a magnetic ion filter for use in removing hydrogen ions in accordance with aspects of the invention.

In some aspects of the invention, a magnetic ion filter, additionally illustrated in the cross-sectional axial view of FIG. 2, is placed between the remote plasma source 52 and the showerhead 40. The ion filter may include two horizontally opposed permanent magnets 62, 64 placed on opposed sides of the supply tube 54 to create a horizontal magnetic field B extending between them and perpendicular to the axis of the supply tube 54. Detailed aspects have the magnets 62, 64 (or a plurality of magnets making an effective combined magnet) have sufficient lateral widths that their magnetic field is substantially constant across the dimension of the supply tube 54 perpendicular to field direction. The magnetic field creates a Lorentz force on the hydrogen ions flowing through the supply tube 54 along its axis, deflecting the ions to the walls of the supply tube 54 where they are absorbed or at least neutralized. Under some conditions, the ions are trapped on the magnetic field lines and either neutralize there or drift to the walls.

Figure 3:
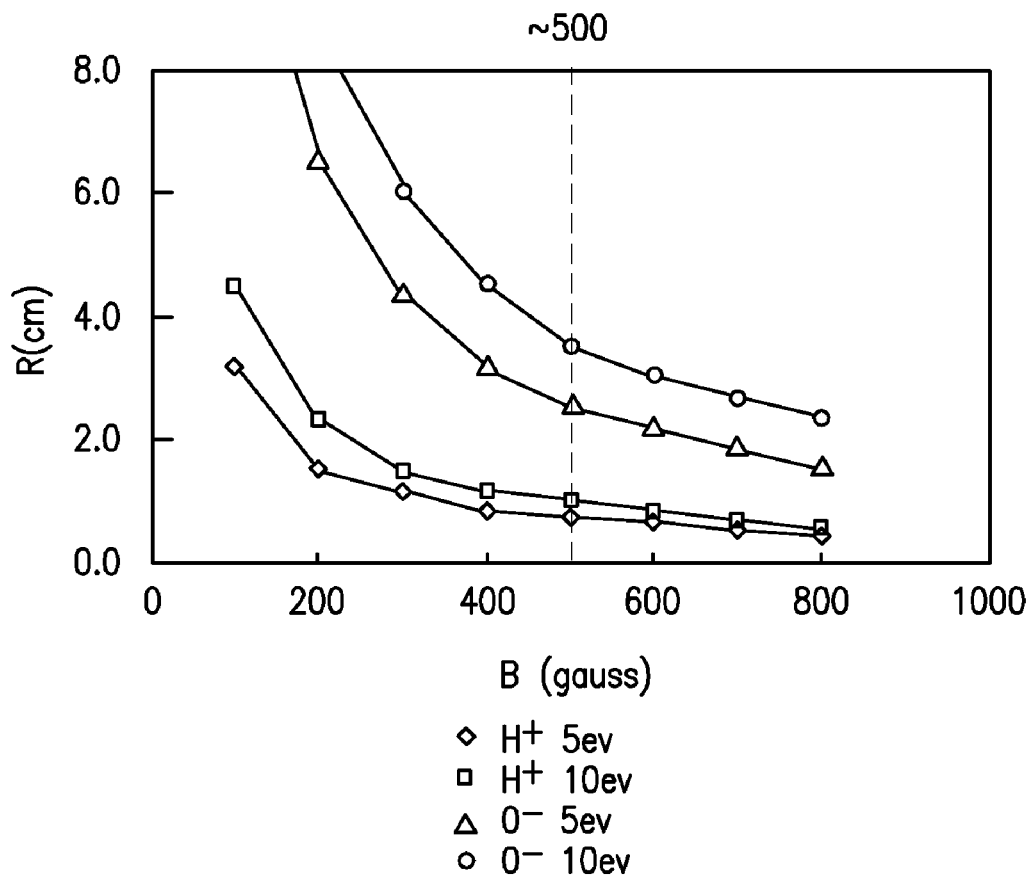
FIG. 3 is a graph of the ion deflection obtained in the magnetic filter of FIG. 2.

The graph of FIG. 3 illustrates the diverting force, measured as the cyclotron radius, for hydrogen and oxygen ions of 5 and 10 eV kinetic energy as a function of applied magnetic field. A 3×2 magnet array is estimated to create a 500 gauss magnetic field at the edge of the supply tube 54 and a 650 gauss magnetic field at its center. This magnetic filter has been found to be effective in removing about 99% of the charged particles exiting the remote plasma source 52.

On the other hand, neutral hydrogen radicals H* are unaffected by the magnetic field and continue to drift with the gas to the manifold 56 and then out of the apertures 42 of the showerhead 40. The hydrogen radicals form an excited but neutral gas and do not technically constitute a plasma containing ions and electrons. This description should not be taken as limiting the ion filter to a magnetic filter and other ion filters may be used. Non-limiting examples of suitable ion filters include electrostatic lenses, quadrupole deflectors, Einzel lenses and ion traps.

However, radicals are often short lived and tend to recombine. Radical lifetimes can be significantly increased by placing, as illustrated in FIGS. 1 and 2, a tubular dielectric liner 66 inside the supply tube 54 extending from the remote plasma source 52 to the manifold 56. The free standing dielectric liner 66 may be composed of, for example, quartz ($SiO_2$) or alumina ($Al_2O_3$). In some detailed aspects, the dielectric liner 66 may be removed from the bottom when the chamber lid is opened for maintenance without the need to dismantle the remote plasma source 52, the ion filter or the remainder of the lid. For the same reasons, the showerhead 40 and its manifold liner 58 may be composed of a dielectric, for example, alumina or quartz.

Accordingly, one or more embodiments of the invention are directed to methods for processing a silicon layer on a substrate. The substrate may be used in a variety of applications with a variety of electronic features. Non-limiting examples include photovoltaic cells, gate electrodes, flash memory devices and processes for manufacturing the same. The silicon layer can be any silicon that may have dangling bonds formed as result of processing. Examples include p-type and n-type silicon, including those silicon types which have been deposited onto a transparent conductive oxide layer which has been deposited on the silicon substrate, for example micro-crystalline Si:H and polycrystalline Si:H layers on a TCO layer.

Figure 4:
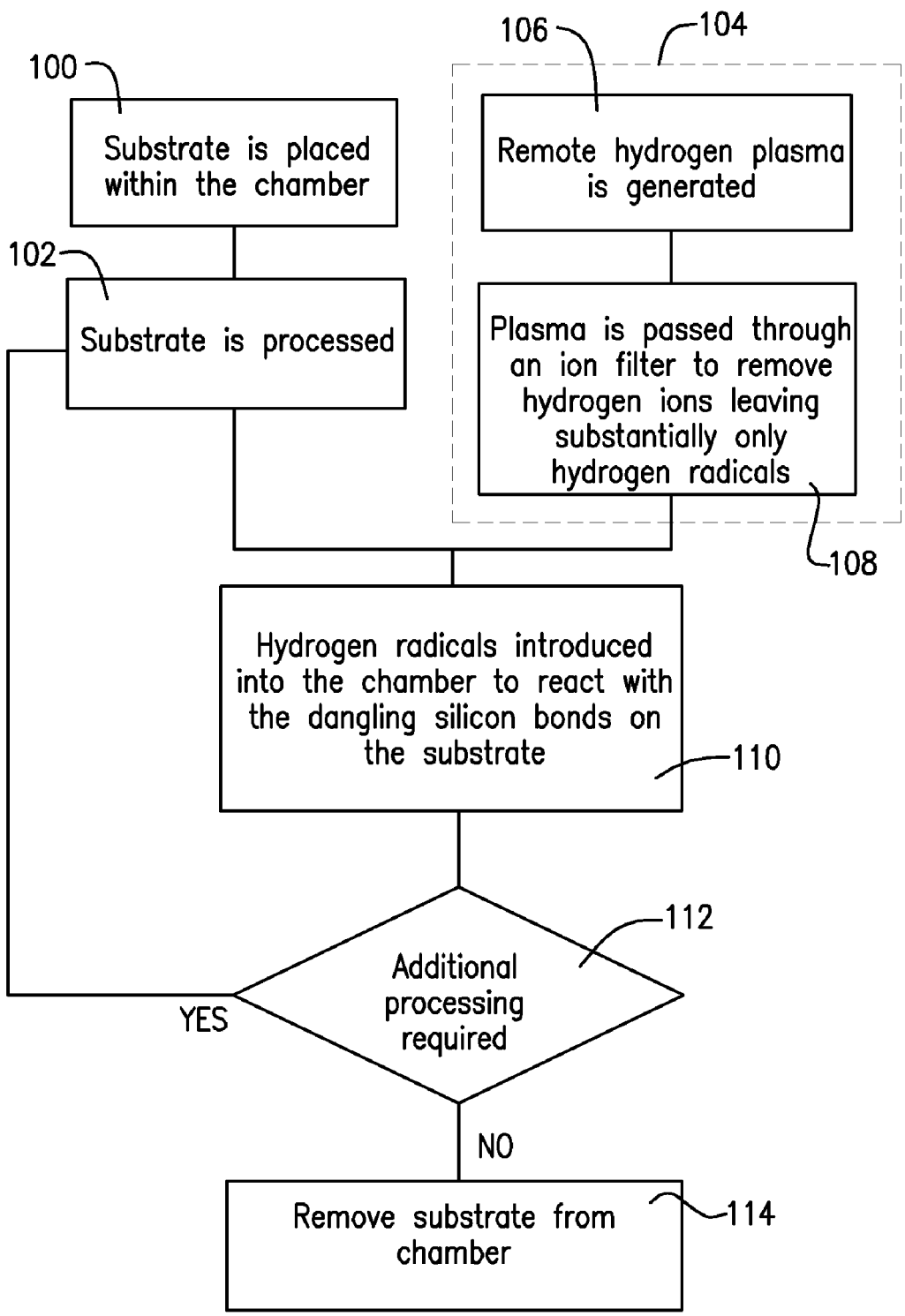
FIG. 4 is a flowchart illustrating the general steps in a processing method in accordance with one or more aspects of the invention.

FIG. 4 shows a flowchart of a typical processing method in accordance with aspects of the invention. A substrate is disposed within a processing chamber 100 by any suitable means, which are known to those skilled in the art. A silicon layer on the substrate is processed 102 resulting in silicon dangling bonds. The processing 102 can be any suitable processing which results in silicon dangling bonds. Non-limiting examples include etching and doping processes.

The steps collected within block 104 can be performed in conjunction with the processing 102 or sequentially after processing 102. A hydrogen plasma is generated in a remote plasma source 106. The plasma is passed through an ion filter, as previously described, to remove hydrogen ions 108. The ion filter is effective to remove substantially all of the hydrogen ions, leaving substantially only hydrogen radicals. As used in this specification and the appended claims, the term "substantially all of the hydrogen ions" and "essentially all of the hydrogen ions" means that greater than about 95% of the ions are removed. In some aspects, the plasma temperature is maintained below 400° C. In other detailed aspects, the plasma temperature is maintained below 300° C. In further detailed aspects, the plasma temperature is maintained below 250° C. The plasma temperature of various embodiments is maintained at temperatures less than about 400°, 350°, 300°, 250° or 200° C.

In one or more detailed embodiments of the invention, the radicals in the hydrogen plasma, which have passed through the ion filter, have an energy level that has been reduced to prevent damage to the silicon oxide layer.

The hydrogen radicals are introduced into the processing chamber to react with the dangling silicon bonds on the substrate 110. This may be done prior to any further processing of the substrate. According to some aspects, the substrate is not subjected to temperatures greater than about 200° C. at any point during the processing. The hydrogen radicals of some aspects penetrate the silicon layer to a depth of less than about 3 μm. The radicals of other aspects penetrates the silicon layer to a depth of less than about 2 μm.

After repairing the silicon dangling bonds using the hydrogen radicals, a decision point is evaluated 112. If further processing is required, steps 102 and those of block 104 can be repeated. Once no further processing is needed the substrate can be removed from the processing chamber 114 after any necessary steps are performed.

Figure 5A:
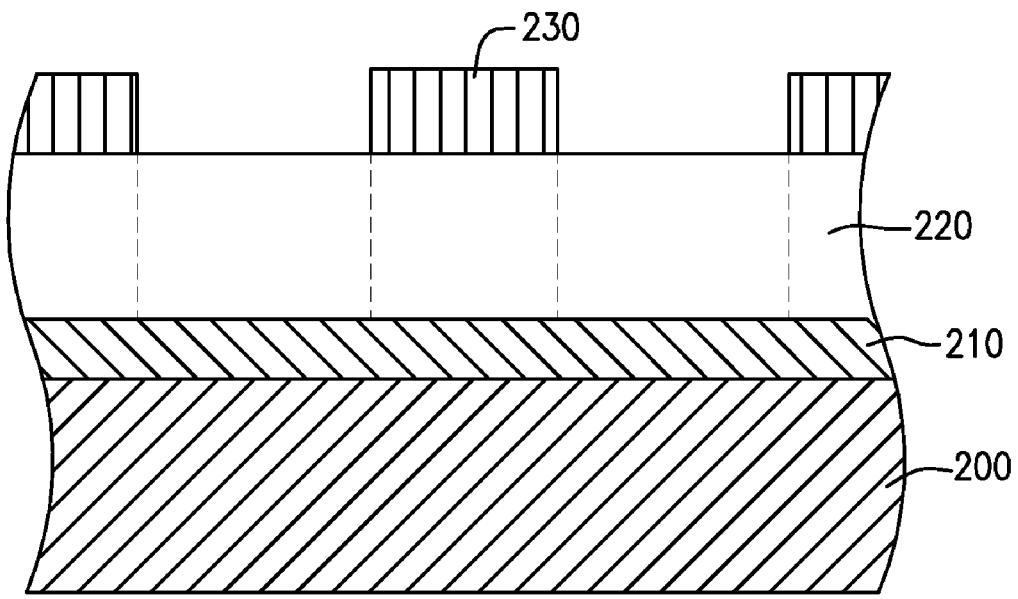
FIGS. 5A and 5B illustrate gate oxide etching including silicon dangling bonds.
Figure 5B:
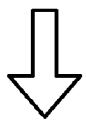
Figure 5B:
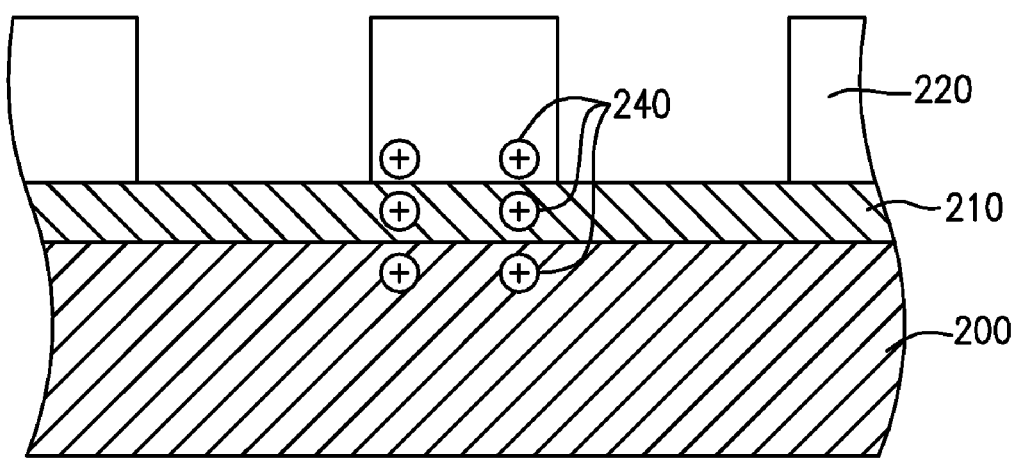

FIG. 5A shows polysilicon gate etch induced damage. A silicon substrate 200 is shown with a $SiO_2$ layer 210 and a poly-silicon layer 220. Although any transparent conductive oxide (TCO) can be substituted for the $SiO_2$ layer 210. On the poly-silicon layer is a photoresist 230. The exposed poly-silicon 220 is etched to expose the $SiO_2$ layer 210 leaving islands of poly-silicon 220 and photoresist 230 (shown with dotted lines). The photoresist 230 can then be removed by oxygen plasma stripping, or other suitable methods, resulting in the gate electrode shown in FIG. 5B. The etching and plasma stripping processes cause dangling silicon bonds 240. Introduction of hydrogen radicals can repair the dangling silicon bonds 240. Detailed aspects of the invention have the energy of the hydrogen radicals such that the hydrogen radicals cause substantially no damage to the $SiO_2$ layer 210. In this specification and the appended claims, the terms "cause substantially no damage" and "has substantially no negative impact" mean the same thing. Essentially, any damage done or resulting negative impact is negligible (i.e., less than about 5%) compared the subject layer before contact with the filtered hydrogen plasma.

Figure 6:
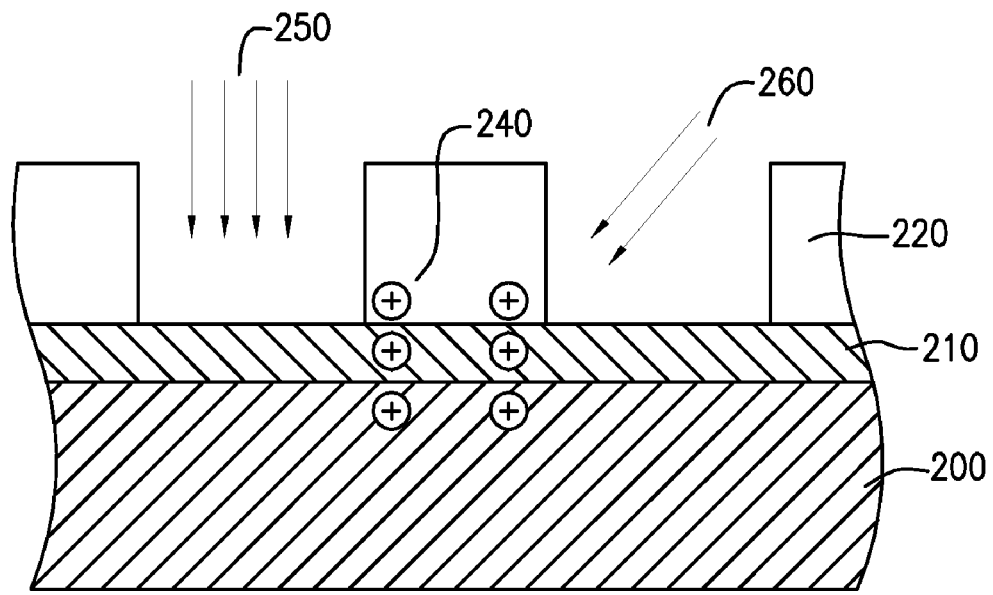
FIG. 6 illustrates implantation induced silicon dangling bonds.

FIG. 6 shows implant induced damage that can be repaired according to aspects of the present invention. After a poly-silicon gate etch (or other dangling bond producing process) is completed, P or As 250 can be vertically implanted into the silicon substrate to form low doped domains. Additionally, $BF_2$ atoms can be implanted on an angle 260 to create a pocket implant, or halo implant. These implants will induce damages like silicon dangling bonds 240 in the silicon 200, $SiO_2$ layer 210 and the poly-silicon 220 which can be repaired. According to some detailed aspects, the dangling bonds can be repaired between each etch or implantation step.

Figure 7A:
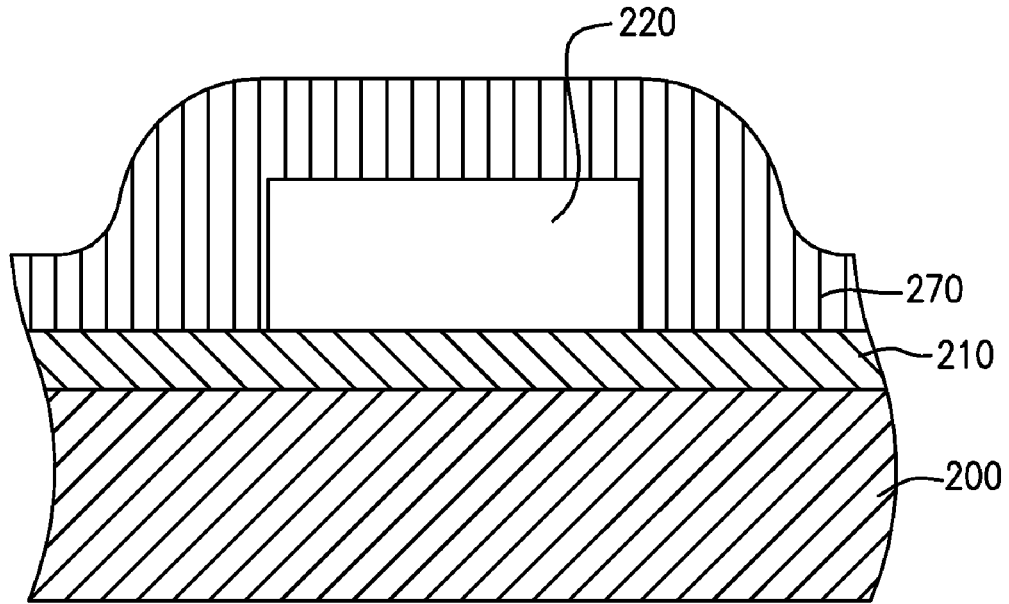
FIGS. 7A and 7B illustrates space etch induced damage.
Figure 7B:
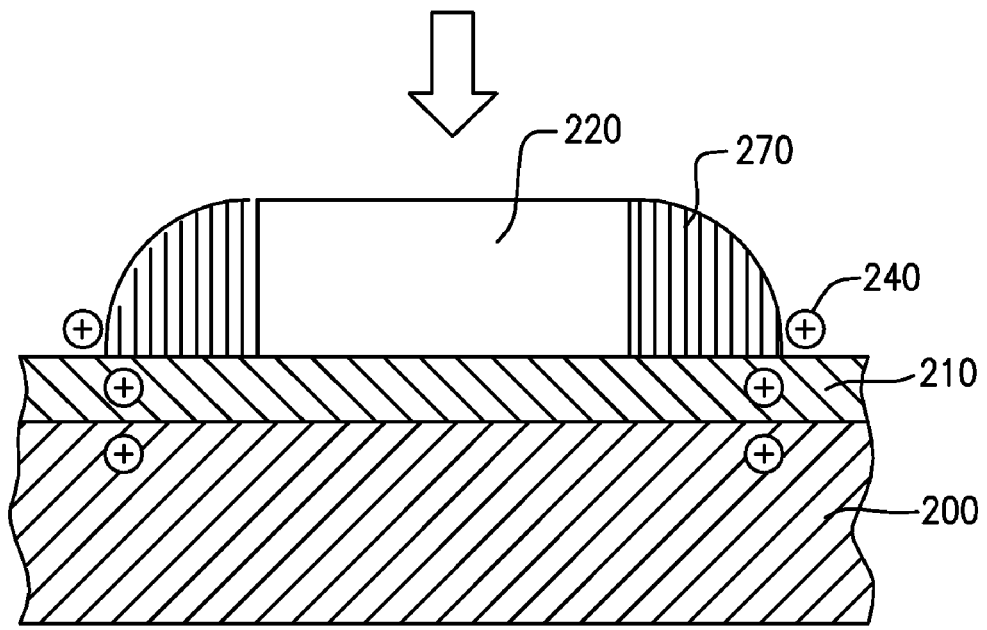

FIG. 7A shows space etch induced damage. A silicon substrate 200, $SiO_2$ layer 210 and poly-silicon 220 are coated with a spacer material 270. The spacer material 270 can be any suitable material known to those skilled in the art. For example, the spacer material 270 can be $SiO_2$/SiN. The spacer material 270 can be etched, resulting in a device similar to that of FIG. 7B where the poly-silicon 220 has the spacer material 270 around the edges. Etching of the spacer material 270 results in silicon dangling bonds 240 which can be repaired by aspects of the present invention.

Figure 8:
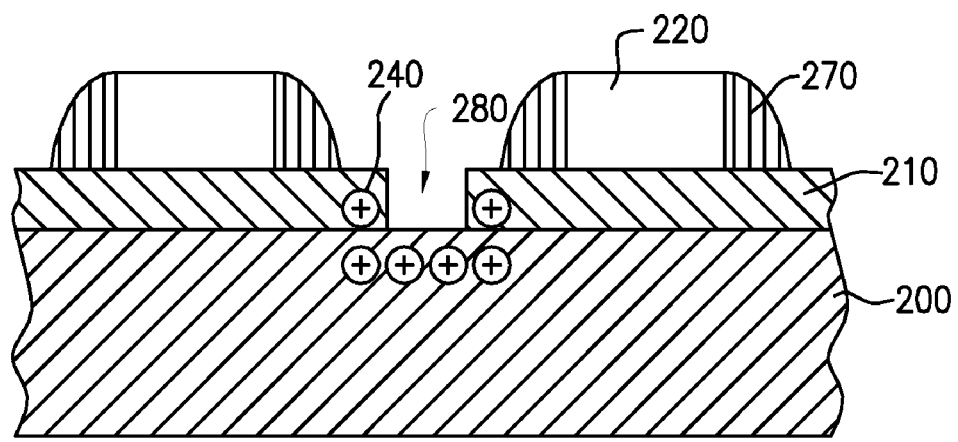
FIG. 8 illustrates contact etch induced damage.

FIG. 8 shows a contact etch between poly-silicon 220/spacer 270 islands. The SiO$_2$ layer 210 can be etched down to the substrate 200. The etch creates a gap 280 in the SiO$_2$ layer 210. This etch can cause dangling bonds 240 which can be repaired by aspects of the present invention.

The electronic devices shown in these figures are merely representative of the processes that cause silicon dangling bonds that can be repaired by aspects of the invention. These examples should, including the specific materials mentioned, should not be read as limiting the scope of the invention.

Reference throughout this specification to "one embodiment," "certain embodiments," "one or more embodiments," "an embodiment," "one aspect," "certain aspects," "one or more embodiments" and "an aspect" means that a particular feature, structure, material, or characteristic described in connection with the embodiment is included in at least one embodiment of the invention. Thus, the appearances of the phrases such as "in one or more embodiments," "in certain embodiments," "in one embodiment," "in an embodiment," "according to one or more aspects," "in an aspect," etc., in various places throughout this specification are not necessarily referring to the same embodiment or aspect of the invention. Furthermore, the particular features, structures, materials, or characteristics may be combined in any suitable manner in one or more embodiments or aspects. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method of processing a silicon layer on a substrate comprising:
    disposing a substrate in a chamber having a remote plasma source coupled thereto;
    processing a silicon layer and creating dangling silicon bonds in the silicon layer;
    generating a hydrogen plasma in the remote plasma source, the hydrogen plasma comprising a mixture including hydrogen radicals and ions;
    passing the hydrogen plasma through an ion filter to remove substantially all of the ions, creating a filtered hydrogen plasma; and
    exposing the silicon layer containing dangling bonds to the filtered hydrogen plasma to remove dangling silicon bonds;
    wherein the substrate is not subjected to temperatures greater than about 200° C.

2. The method of claim 1, wherein processing the silicon layer includes one or more of etching or doping the silicon layer.

3. The method of claim 1, wherein processing the silicon layer comprises etching the silicon layer, creating dangling silicon bonds.

4. The method of claim 1, wherein processing the silicon layer comprises doping the silicon layer creating dangling silicon bonds.

5. The method of claim 1, wherein the hydrogen plasma is at a temperature less than about 400° C.

6. The method of claim 1, wherein the hydrogen plasma is at a temperature less than about 300° C.

7. The method of claim 1, wherein the silicon layer is in a gate electrode.

8. The method of claim 1, wherein the hydrogen radicals in the hydrogen plasma which have passed through the ion filter have an energy level that has been reduced to prevent damage to the silicon layer.

9. The method of claim 1, wherein the hydrogen radicals penetrate the silicon layer to a depth of less than about 3 µm.

10. The method of claim 1, wherein the hydrogen radicals penetrate the silicon layer to a depth of less than about 2 µm.

11. The method of claim 9, wherein the silicon layer is a p-type or n-type silicon which has been deposited onto a transparent conductive oxide layer deposited on a silicon substrate.

12. The method of claim 11, wherein the silicon layer is part of a photovoltaic cell, and the energy of the hydrogen radicals is such that they cause substantially no damage to the transparent conductive oxide layer.

13. The method of claim 4, wherein the silicon layer comprises a silicon oxide layer deposited on a silicon substrate, the silicon layer having one or more of P, As and BF$_2$ implanted therein.

14. The method of claim 7, wherein the gate electrode comprises polysilicon gates and the dangling bonds are created during an etching process.

15. The method of claim 3, wherein the method is part of a flash memory manufacturing process.

16. A method of processing a Si:H layer on solar cell comprising:
    disposing a substrate in a chamber having a remote plasma source coupled thereto;
    creating dangling silicon bonds in the Si:H layer;
    generating a hydrogen plasma in the remote plasma source, the hydrogen plasma comprising a mixture including hydrogen radicals and ions;
    passing the hydrogen plasma through an ion filter to remove essentially all of the ions, creating a filtered hydrogen plasma; and
    exposing the Si:H layer containing dangling bonds to the filtered hydrogen plasma to remove dangling silicon bonds;
    wherein processing of the Si:H layer occurs at a temperature below about 200° C.

17. The method of claim 16, wherein the Si:H layer comprises polysilicon.

18. The method of claim 16, wherein the Si:H layer comprises micro-crystalline silicon.

19. The method of claim 18, wherein the Si:H layer is disposed on a transparent conductive oxide layer and the plasma has substantially no negative impact the transparent conductive oxide layer.

* * * * *